(12) United States Patent
Ohno

(10) Patent No.: US 6,586,295 B2
(45) Date of Patent: Jul. 1, 2003

(54) SEMICONDUCTOR DEVICE MANUFACTURING METHOD AND SEMICONDUCTOR DEVICE

(75) Inventor: Yoshikazu Ohno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 5 days.

(21) Appl. No.: 09/755,073

(22) Filed: Jan. 8, 2001

(65) Prior Publication Data

US 2002/0004269 A1 Jan. 10, 2002

(30) Foreign Application Priority Data

Jul. 10, 2000 (JP) .......................................... 2000-207674

(51) Int. Cl.[7] .......................................... H01L 21/8238
(52) U.S. Cl. .................... 438/221; 438/296; 438/473; 438/433; 438/524; 438/528
(58) Field of Search ......................... 438/58, 143, 310, 438/402, 471, 433, 221, 296, 473, 524, 528, FOR 145

(56) References Cited

U.S. PATENT DOCUMENTS

| 4,968,636 | A |   | 11/1990 | Sugawara |   |
|---|---|---|---|---|---|
| 5,098,852 | A | * | 3/1992 | Niki et al. | 437/11 |
| 5,449,630 | A |   | 9/1995 | Lur et al. |   |
| 5,465,860 | A | * | 11/1995 | Fujimoto et al. | 216/24 |
| 6,248,645 | B1 | * | 6/2001 | Matsuoka et al. | 438/424 |
| 6,274,422 | B1 | * | 8/2001 | Wakita | 438/238 |

FOREIGN PATENT DOCUMENTS

| EP | 0 889 550 | 1/1999 |
|---|---|---|
| JP | 2-39436 | 2/1990 |
| JP | 3-215943 | 9/1991 |
| JP | 11-297703 | 10/1999 |
| JP | 2000-058635 | 2/2000 |
| KR | 1998-058385 | 10/1998 |

OTHER PUBLICATIONS

Nishikawa Kiichi, Semiconductor Integrated Circuit Device, Patent Abstracts of Japan, Pub. 03215943.*
Murakami Isao, Manufacture of Semiconductor Device, Patent Abstracts of Japan, Pub. 02039436.*

* cited by examiner

*Primary Examiner*—George Fourson
*Assistant Examiner*—Khiem Nguyen
(74) *Attorney, Agent, or Firm*—McDermott, Will & Emery

(57) ABSTRACT

A trench 5 for element separation is formed in a silicon substrate 1 by an etching process using an SiO$_2$ film 2 as a mask (FIG. 1B). Side walls 18 are formed in a manner covering the trench 5 laterally (FIG. 1C). Defect-forming ions such as silicon ions are implanted into the silicon substrate 1 with the SiO$_2$ film 2 and side walls 18 used as a mask, whereby a gettering layer 1 is formed only at a bottom of the trench 5.

7 Claims, 12 Drawing Sheets

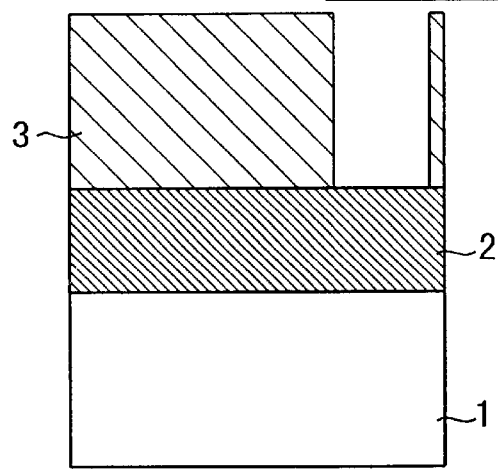
Fig. 11A *PRIOR ART*
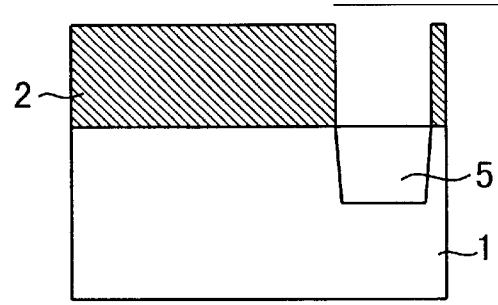
Fig. 11B *PRIOR ART*
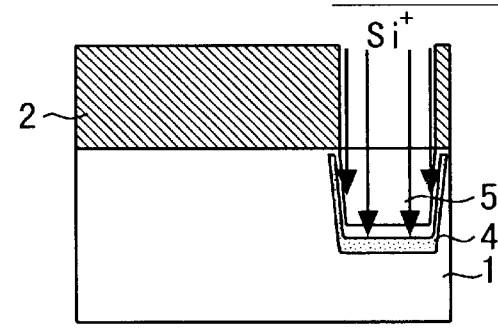
Fig. 11C *PRIOR ART*
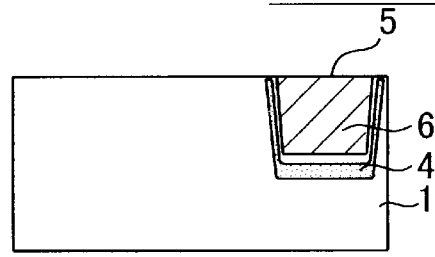
Fig. 11D *PRIOR ART*

SEMICONDUCTOR DEVICE MANUFACTURING METHOD AND SEMICONDUCTOR DEVICE

BACKGROUND OF THE INVENTION

1. Field of the Invention

The present invention relates to a semiconductor device manufacturing method and a semiconductor device. More particularly, the invention relates to a method for manufacturing a semiconductor device having a trench isolation structure and to a semiconductor device fabricated by that method.

2. Description of the Background Art

As semiconductor devices including DRAMs (dynamic random access memories) are getting increasingly integrated today, studies are under way to apply what is known as a trench isolation method to their fabrication. The method involves separating elements in much more minute regions than the conventional LOCOS (localized oxidation of silicon) scheme.

In the field of semiconductor devices, there is a known technique for removing from a silicon substrate defects and metal impurities that may adversely affect device characteristics. That technique involves intentionally forming a defective layer (called a gettering layer) in internal regions of the silicon substrate in such a manner that the formed layer will capture those defects and metal impurities from within the substrate. The gettering layer may be fabricated illustratively by implanting oxygen or silicon ions into the silicon substrate.

FIGS. 11A through 11D and 12A through 12C show a flow of conventional processes in which a gettering layer is formed by implanting ions into element isolation regions of a DRAM having a trench isolation structure. Conventionally, as indicated in FIG. 11A, an $SiO_2$ film 2 is first formed by CVD on a silicon substrate 1. On the $SiO_2$ film 2 is formed a resist film 3 having openings where element isolation regions are to be fabricated. After the $SiO_2$ film 2 is etched with the resist film 3 used as a mask, the resist film 3 is removed.

The silicon substrate 1 is then etched using the $SiO_2$ film 2 as a mask. This forms a trench 5 for element isolation in the silicon substrate 1, as depicted in FIG. 11B.

Silicon ions are then implanted into the silicon substrate 1. This forms a defective layer called a gettering layer 4 in regions close to the trench 5 in the silicon substrate 1, as shown in FIG. 11C. The gettering layer 4 is formed not only near the bottom of the trench 5 but also in the vicinity of its sides.

After the $SiO_2$ film 2 is removed, an insulation film 6 is deposited into the trench 5, as depicted in FIG. 11D.

Gate electrodes 7 are then formed on the silicon substrate 1 with a gate insulation film interposed therebetween, as shown in FIG. 12A. When impurities are implanted into the substrate using the gate electrodes 7 as a mask, source drain impurity layers 8 and 9 are formed over the surface of the silicon substrate 1.

An insulation layer 10 is formed next by CVD all over the silicon substrate 1, as depicted in FIG. 12B. Formation of the insulation layer 10 is followed by fabrication of bit lines 11 that conduct to the source drain impurity layer 9.

As shown in FIG. 12C, an insulation film 12 is deposited by CVD on the bit lines 11. Thereafter, there is fabricated a memory cell capacitor including a lower electrode 13 conducting to the source drain impurity layer 8, a dielectric film 14, and an upper electrode 15. The memory cell capacitor is topped with an insulation film 16 and aluminum wiring 17.

As outlined above, when the getting layer 4 (defective layer) is conventionally formed in the trench isolation region, that layer 4 also appears on the sides of the trench 5. In that case, the gettering layer 4 may come into contact with the source drain impurity layer 8, as shown in FIG. 12C.

The getting layer 4 in contact with the source drain impurity layer 8 provokes a leak current increase in the source drain impurity layer 8 leading to a deterioration of device characteristics such as retention. This is one disadvantage of the conventionally fabricated gettering layer, i.e., its propensity toward device characteristic degradation.

SUMMARY OF THE INVENTION

It is therefore a first object of the present invention to overcome the above and other deficiencies of the prior art and to provide a method for fabricating in a semiconductor device a gettering layer for capturing defects from within a silicon substrate while preventing internal formation of a gettering layer prone to degrade device characteristics.

It is a second object of the present invention to provide a semiconductor device that is manufactured by the inventive method above.

The above objects of the present invention are achieved by a method for manufacturing a semiconductor device having a trench isolation structure. In the method, defect-forming ions are implanted into a silicon substrate so as to form a gettering layer only at a bottom of a trench formed in said silicon substrate.

The above objects of the present invention are also achieved by a method for manufacturing a semiconductor device having a trench isolation structure. In the method, defect-forming ions are implanted into a silicon substrate so as to form a gettering layer in regions where a trench is to be formed in said silicon substrate. Defective elements are captured into said gettering layer from within said silicon substrate. The gettering layer having said defective elements captured therein is removed during formation of said trench in said silicon substrate.

The above objects of the present invention are further achieved by a semiconductor device manufactured by the method described above.

Other objects and further features of the present invention will be apparent from the following detailed description when read in conjunction wit h the accompanying drawings.

BRIEF DESCRIPTION OF THE DRAWINGS

FIGS. 11A through 11D and FIGS. 12A through 12C are explanatory views of processes constituting a conventional method for manufacturing a semiconductor device; and

DESCRIPTION OF THE PREFERRED EMBODIMENTS

Figure 1A:
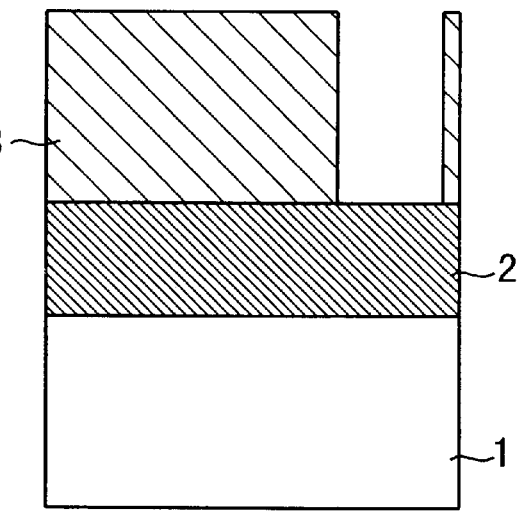
FIGS. 1A through 1D and FIGS. 2A through 2D are explanatory views of processes constituting a method for manufacturing a semiconductor device as a first embodiment of this invention.

Preferred embodiments of this invention will now be described with reference to the accompanying drawings. Throughout the drawings, like or corresponding parts are designated by the same reference numerals and their descriptions are omitted where redundant.

First Embodiment

FIGS. 1A through 2D are explanatory views of processes constituting a method for manufacturing a semiconductor device as a first embodiment of this invention.

As shown in FIG. 1A, an $SiO_2$ film 2 is deposited by CVD on a silicon substrate 1. The $SiO_2$ film 2 is topped with a resist film 3 having openings where element isolation regions are to be fabricated. After the $SiO_2$ film 2 is etched using the resist film 3 as a mask, the resist film 3 is removed.

Figure 1B:
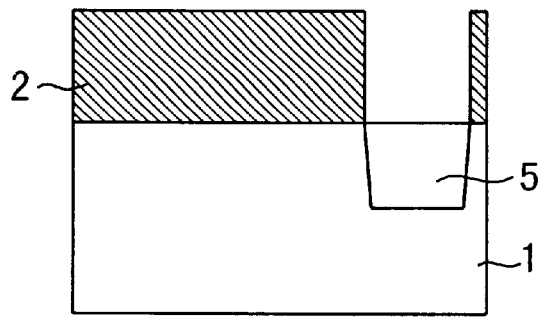

The silicon substrate 1 is etched next with the $SiO_2$ film 2 used as a mask. This forms a trench 5 for element isolation in the silicon substrate 1, as depicted in FIG. 1B.

Figure 1C:
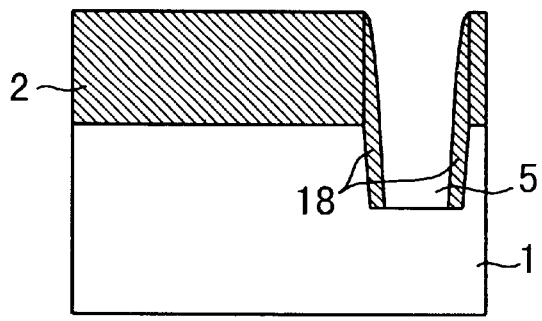

With this manufacturing method, side walls 18 are formed in a manner covering laterally side surfaces of the opening in the $SiO_2$ film 2 and side surfaces of the trench 5, as shown in FIG. 1C. Formation of the side walls 18 involves first having $SiO_2$ deposited by CVD into the interior of the trench 5 and then suitably removing the deposited $SiO_2$ through anisotropic etching.

Figure 1D:
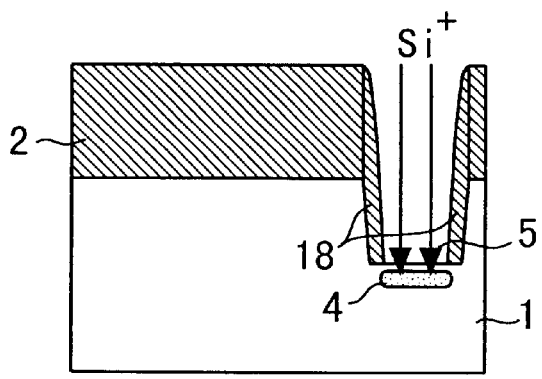

With the $SiO_2$ film 2 and the side walls 18 used as a mask, silicon ions are implanted into an exposed bottom of the trench 5 in the silicon substrate 1. This forms a gettering layer 4 only at the bottom of the trench 5 in a self-aligned manner, as illustrated in FIG. 1D.

Figure 2A:
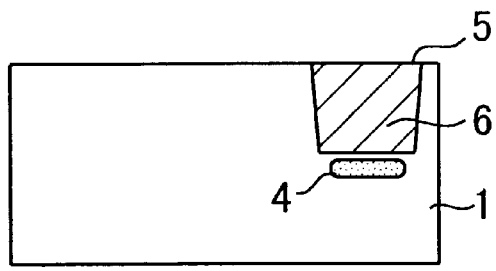

After the gettering layer 4 is formed, the side walls 18 and the $SiO_2$ film 2 are removed. Thereafter, as shown in FIG. 2A, an insulation film 6 is deposited into the trench 5. The insulation film 6 is formed by first having silicon oxide deposited by CVD all over the silicon substrate 1 and then getting unnecessary portions of silicon oxide removed using the etch-back technique.

Figure 2B:
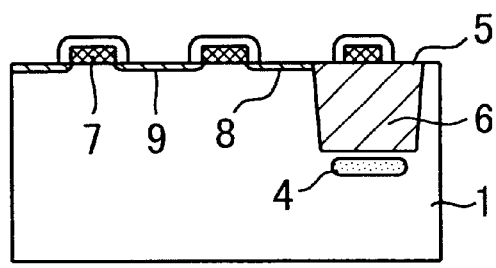

Gate electrodes 7 are then formed on the silicon substrate 1 with a gate insulation film interposed therebetween, as shown in FIG. 2B. Implanting impurities using the gate electrodes 7 as a mask fabricates source drain impurity layers 8 and 9 over the surface of the silicon substrate 1.

Figure 2C:
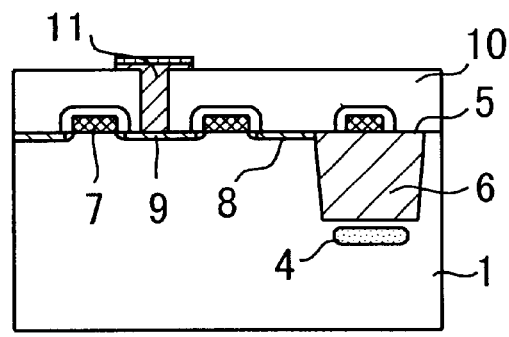

An insulation film 10 is deposited by CVD all over the silicon substrate 1, as depicted in FIG. 2C. Formation of the insulation film 10 is followed by fabrication of bit lines 11 that conduct to the source drain impurity layer 9.

Figure 2D:
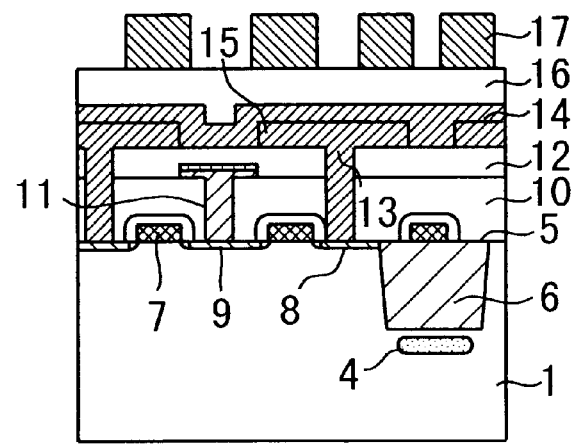

An insulation film 12 is deposited by CVD over the bit lines 11, as illustrated in FIG. 2D. Thereafter, there is fabricated a memory cell capacitor including a lower electrode 13 conducting to the source drain impurity layer 8, a dielectric film 14, and an upper electrode 15. The memory cell capacitor is topped with an insulation film 16 and aluminum wiring 17.

As described and according to the method for manufacturing the semiconductor device as the first embodiment, the gettering layer 4 is formed in a self-aligned manner only at the bottom of the trench 5 with no defective layer formed near the side walls of the trench 5. This makes it possible to prevent unfailingly any contact between the gettering layer 4 and the source drain impurity layer 8, whereby a semiconductor device with stable characteristics is fabricated.

Second Embodiment

A method for manufacturing a semiconductor device as a second embodiment of this invention will now be described by referring to FIGS. 3A through 4C.

Figure 3A:
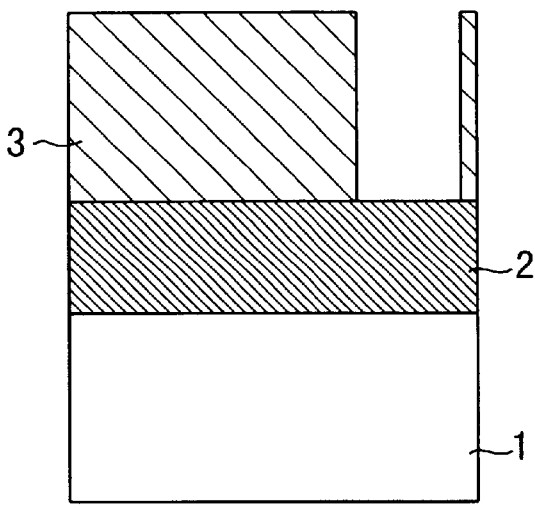
FIGS. 3A through 3D and FIGS. 4A through 4C are explanatory views of processes constituting a method for manufacturing a semiconductor device as a second embodiment of the invention.

As shown in FIG. 3A, an $SiO_2$ film 2 and a resist film 3 are formed on a silicon substrate 1 in the same manner as with the first embodiment.

After the SiO2 film 2 is etched using the resist film 3 as a mask, the resist film 3 is removed.

Figure 3B:
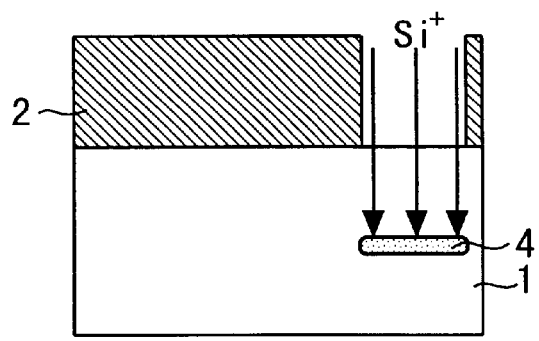

With the $SiO_2$ film 2 used as a mask, silicon ions are implanted into the silicon substrate 1 as depicted in FIG. 3B. The silicon ions are implanted in such a manner that they will reach regions deeper than a trench to be formed for element isolation. As a result, a gettering layer 4 is formed deeper than element isolation regions.

Figure 3C:
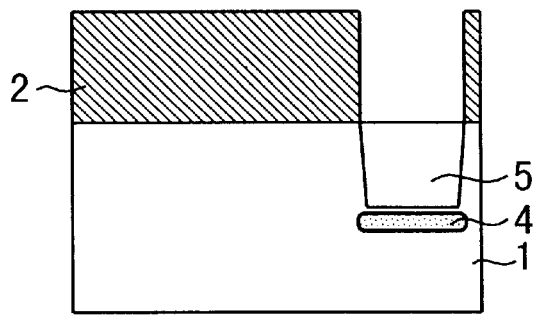

As shown in FIG. 3C, the silicon substrate 1 is then etched using the $SiO_2$ film 2 as a mask. This forms the trench 5 for element isolation in the silicon substrate 1.

Figure 3D:
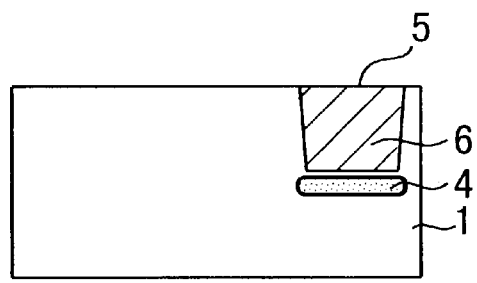
Figure 4A:
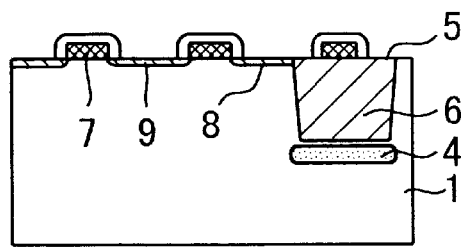
Figure 4B:
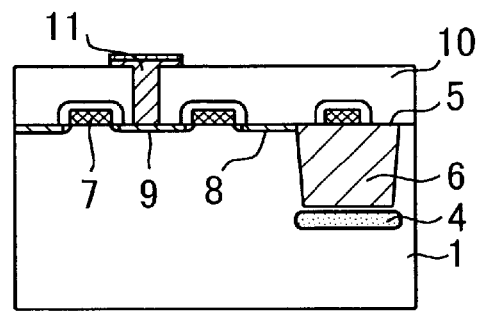
Figure 4C:
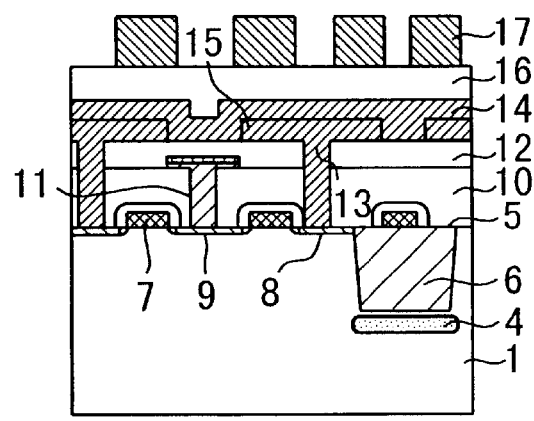

After the $SiO_2$ film 2 is removed, an insulation film 6 is deposited into the trench 5 as depicted in FIG. 3D. Formation of the insulation film 6 involves first having silicon oxide deposited by CVD all over the silicon substrate 1 and then getting unnecessary portions of silicon oxide removed using the etch-back technique. Thereafter, memory cells of the DRAM are formed in the same processes as those of the first embodiment (FIGS. 4A through 4C).

As described and according to the method for manufacturing the semiconductor device as the second embodiment, the defects stemming from implantation of silicon ions into the silicon substrate 1 are removed during formation of the trench 5 except for those defects that exist deeper than the trench 5. This allows the gettering region 4 to be formed only near the bottom of the trench 5. The method of the second embodiment, as with the first embodiment, permits manufacture of a semiconductor device with stable characteristics.

Although the second embodiment above was shown having ions implanted with the $SiO_2$ film 2 used as a mask, as shown in FIG. 3B, this is not limitative of the invention. Alternatively, as in the case of the first embodiment, side walls 18 may be formed laterally in the openings of the $SiO_2$ film 2 so as to perform ion implantation using both the $SiO_2$ film 2 and the side walls 18 as a mask.

Third Embodiment

A method for manufacturing a semiconductor device as a third embodiment of this invention will now be described by referring to FIGS. 5A through 7D.

Figure 5A:
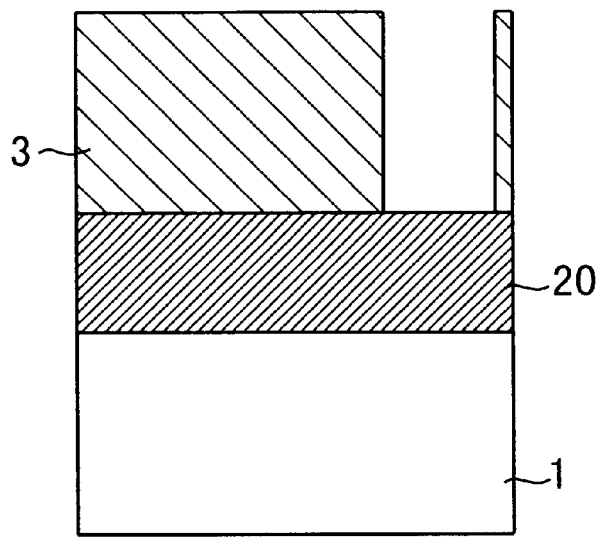
FIGS. 5A through 5C, FIGS. 6A through 6C and FIGS. 7A through 7D are explanatory views of processes constituting a method for manufacturing a semiconductor device as a third embodiment of the invention.

In this embodiment, an $Si_3N_4$ film 20 is formed by CVD on a silicon substrate 1 as shown in FIG. 5A. The $Si_3N_4$ film 20 is topped with a resist film 3 having openings where element isolation regions are to be fabricated. After the $Si_3N_4$ film 20 is etched with the resist film 3 used as a mask, the resist film 3 is removed.

Figure 5B:
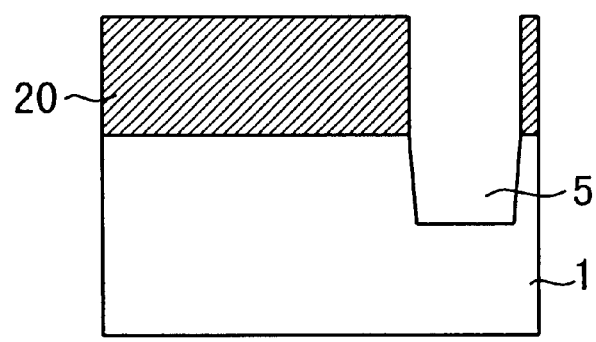

The silicon substrate 1 is etched next with the $Si_3N_4$ film 20 used as a mask. This forms a trench 5 for element isolation in the silicon substrate 1, as depicted in FIG. 5B.

Figure 5C:
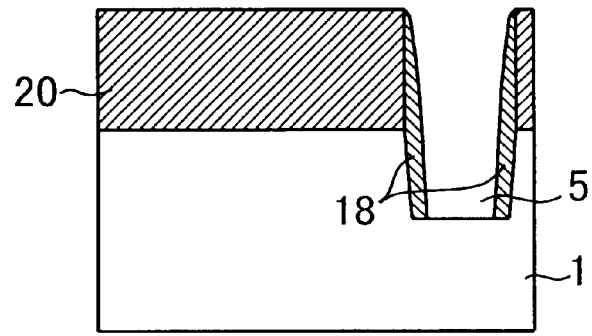

As shown in FIG. 5C, side walls 18 are then formed to cover laterally the side surfaces of the opening in the $Si_3N_4$ film 20 and side surfaces of the trench 5. Formation of the side walls 18 involves first having $SiO_2$ deposited by CVD into the interior of the trench 5 and then suitably removing the deposited $SiO_2$ through anisotropic etching.

Figure 6A:
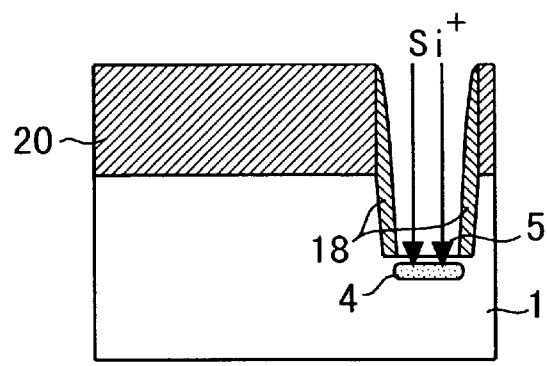

With the $Si_3N_4$ film 20 and the side walls 18 used as a mask, silicon ions are implanted into an exposed bottom of the trench 5 in the silicon substrate 1. This forms a gettering layer 4 only at the bottom of the trench 5 as illustrated in FIG. 6A.

Figure 6B:
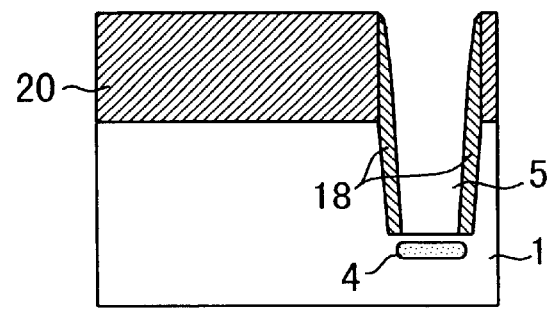

The silicon substrate 1 is then subjected to a suitable heat treatment so that metal impurities and defects adversely affecting device characteristics will be collected into the gettering layer 4 (FIG. 6B).

Figure 6C:
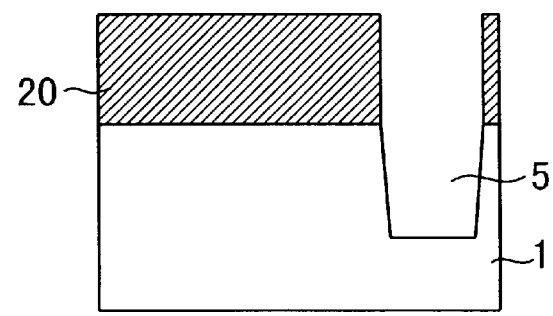

After the heat treatment, the side walls 18 are removed. The silicon substrate 1 is then etched using the $Si_3N_4$ film 20 as a mask. This removes the gettering layer 4 from the silicon substrate 1 as shown in FIG. 6C.

Figure 7A:
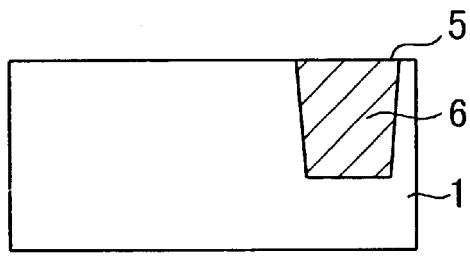
Figure 7B:
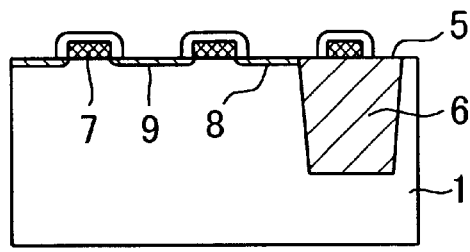
Figure 7C:
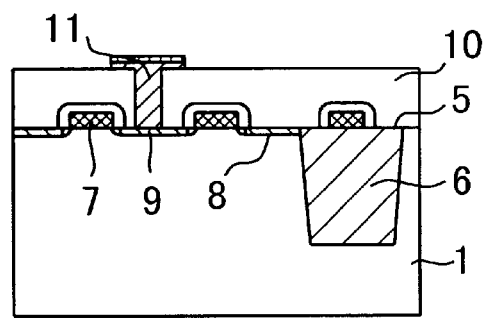
Figure 7D:
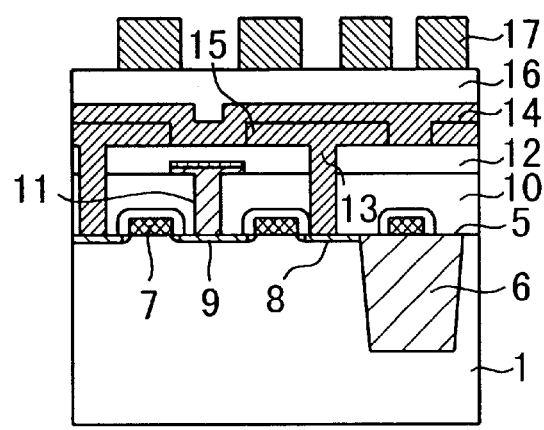

After removal of the $Si_3N_4$ film 20, an insulation film 6 is deposited into the trench 5 as depicted in FIG. 7A. Formation of the insulation film 6 involves first having silicon oxide deposited by CVD all over the silicon substrate 1 and then getting unnecessary portions of silicon oxide removed using the etch-back technique. Thereafter, memory cells of the DRAM are formed in the same processes as those of the first embodiment (FIGS. 7B through 7D).

As described and according to the method for manufacturing the semiconductor device as the third embodiment, the gettering layer 4 is formed in a self-aligned manner at the bottom of the trench 5 so that metal impurities and defects are collected into the layer 4. The gettering layer 4 with the metal impurities and defects captured therein is later removed from the silicon substrate 1 during formation of memory cells. This permits manufacture of a semiconductor device with quite stable characteristics.

Fourth Embodiment

A method for manufacturing a semiconductor device as a fourth embodiment of this invention will now be described by referring to FIGS. 8A through 10C.

Figure 8A:
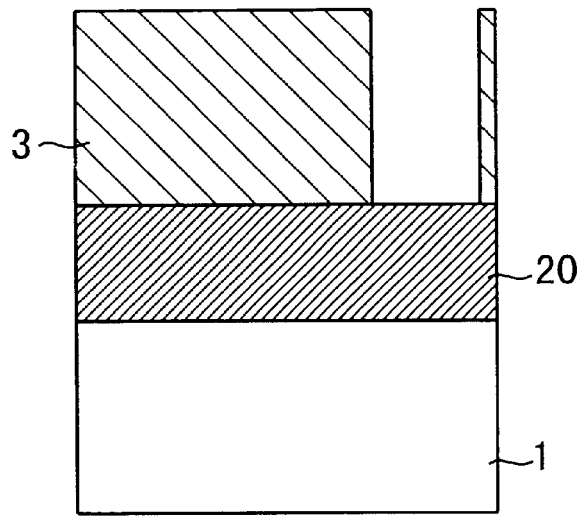
FIGS. 8A through 8C, FIGS. 9A through 9C and FIGS. 10A through 10C are explanatory views of processes constituting a method for manufacturing a semiconductor device as a fourth embodiment of the invention.

In this embodiment, an $Si_3N_4$ film 20 deposited is formed by CVD on a silicon substrate 1 as shown in FIG. 8A. The $Si_3N_4$ film 20 is topped with a resist film 3 having openings where element isolation regions are to be fabricated. After the $Si_3N_4$ film 20 is etched with the resist film 3 used as a mask, the resist film 3 is removed.

Figure 8B:
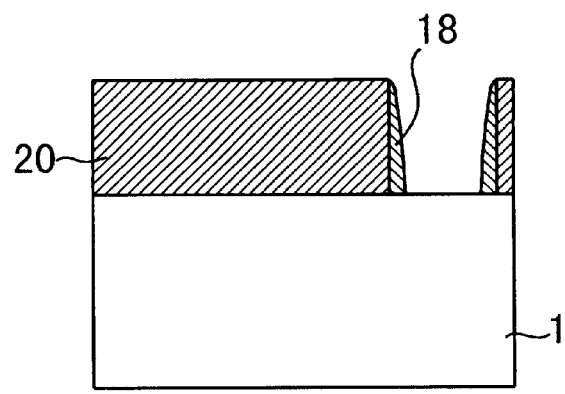

As shown in FIG. 8B, side walls 18 are then formed to cover laterally side surfaces of the openings in the $Si_3N_4$ film 20. Formation of the side walls 18 involves first having $SiO_2$ deposited by CVD to fill the openings of the $Si_3N_4$ film 20 and then suitably removing the deposited $SiO_2$ through anisotropic etching.

Figure 8C:
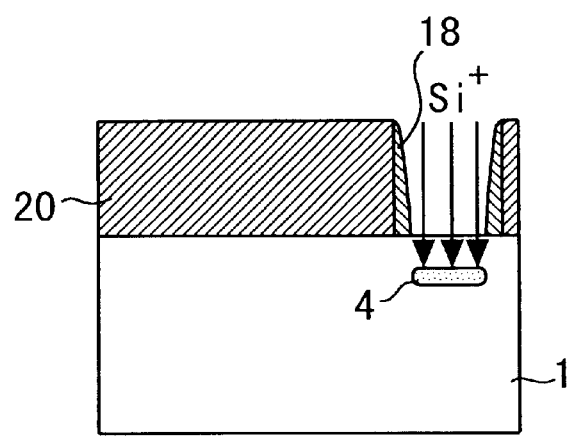

With the $Si_3N_4$ film 20 and the side walls 18 used as a mask, silicon ions are implanted into exposed portions of the silicon substrate 1. The silicon ions are implanted in such a manner that they will reach regions shallower than a trench formed for element isolation. As a result, a gettering layer 4 is formed in portions where the trench is to be formed in the silicon substrate 1, as shown in FIG. 8C.

Figure 9A:
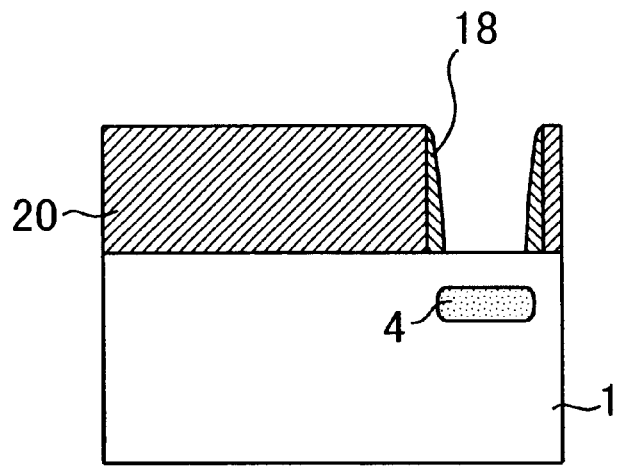

The silicon substrate 1 is then subjected to a suitable heat treatment so that metal impurities and defects adversely affecting device characteristics will be collected into the gettering layer 4 (FIG. 9A).

Figure 9B:
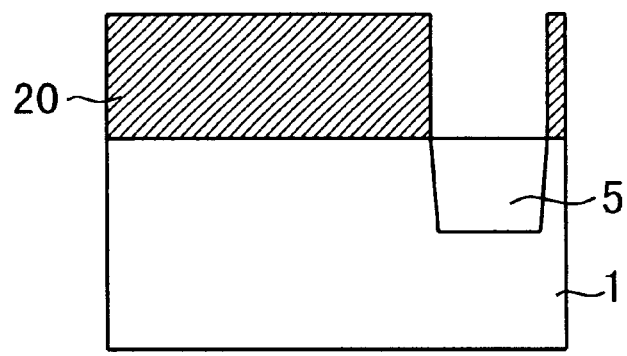

After removal of the side walls 18, the silicon substrate 1 is etched using the $Si_3N_4$ film 20 as a mask. This fabricates the trench 5 for element isolation in the silicon substrate 1, as depicted in FIG. 9B. At this point, the gettering layer 4 with the metal impurities and defects captured therein is removed from the silicon substrate 1.

Figure 9C:
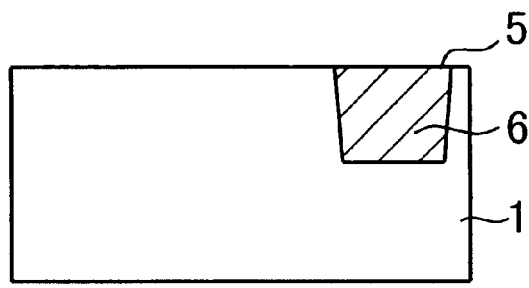
Figure 10A:
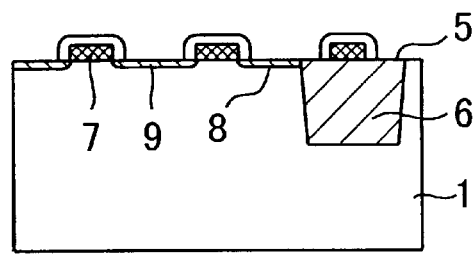
Figure 10B:
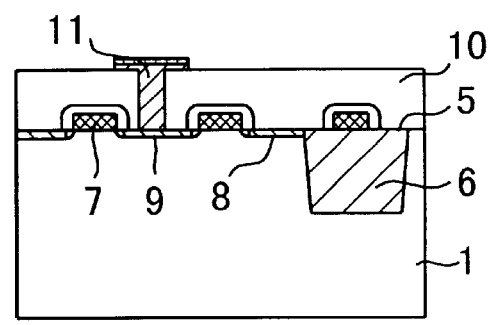
Figure 10C:
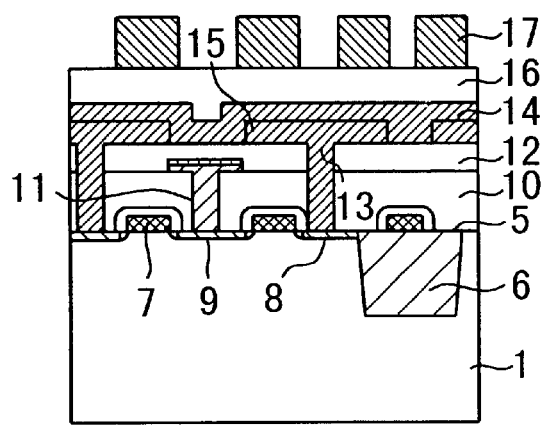
Figure 12A:
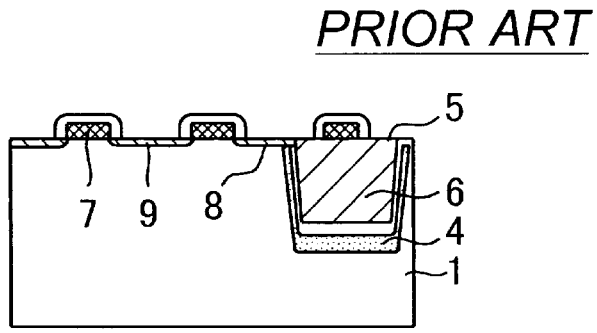
Figure 12B:
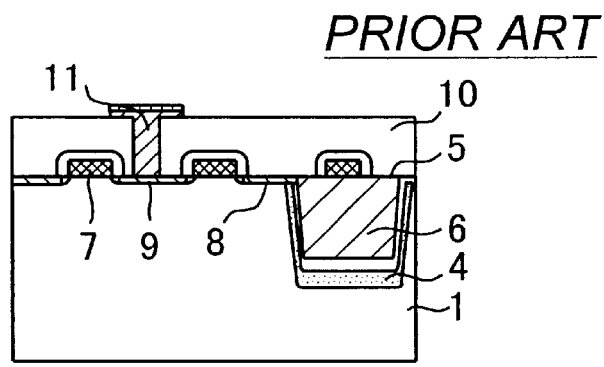
Figure 12C:
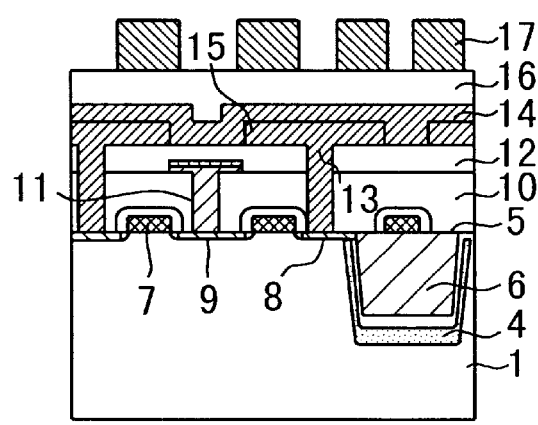

After removal of the $Si_3N_4$ film 20, an insulation film 6 is deposited into the trench 5 as depicted in FIG. 9C. Formation of the insulation film 6 involves first having silicon oxide deposited by CVD all over the silicon substrate 1 and then getting unnecessary portions of silicon oxide removed using the etch-back technique. Thereafter, memory cells of the DRAM are formed in the same processes as those of the first embodiment (FIGS. 10A through 10C).

As described and according to the method for manufacturing the semiconductor device as the fourth embodiment, the gettering layer 4 is formed in a self-aligned manner at the bottom of the trench 5 so that metal impurities and defects are collected into the layer 4. The gettering layer 4 with the metal impurities and defects captured therein is later removed from the silicon substrate 1 during formation of the trench 5. This permits manufacture of a semiconductor device with quite stable characteristics using a simplified manufacturing procedure.

Although the fourth embodiment above was shown having ions implanted with both the $Si_3N_4$ film 20 and the side walls 18 used as a mask, as shown in FIG. 8C, this is not limitative of the invention. Alternatively, ion implantation may be carried out with only the $Si_3N_4$ film 20 used as the mask while the side walls 18 are excluded from assuming the role of a mask.

Structured as described above, the present invention offers the following major effects:

A method for manufacturing a semiconductor device according to a first aspect of the invention permits formation of a gettering layer only at a bottom of a trench. The structure unfailingly forestalls any contact between the gettering layer and an impurity layer formed close to the surface of a silicon substrate, whereby a semiconductor device with stable characteristics is manufactured.

One preferred method for manufacturing a semiconductor device according to the first aspect of the invention causes defect-forming ions to be implanted into the silicon substrate using a trench-forming mask. In this case, a gettering layer is formed in a self-aligned fashion only under the trench. This allows the desired gettering layer to be formed with precision using a simplified manufacturing procedure.

Another preferred method for manufacturing a semiconductor device according to the first aspect of the invention causes defect-forming ions to be implanted into a trench covered with side walls so as to form a gettering layer. This permits accurate formation of the gettering layer (i.e., defective layer) only at a bottom of the trench with no defective layer formed laterally along the trench.

A further preferred method for manufacturing a semiconductor device according to the first aspect of the invention permits fabrication of a gettering layer in regions deeper than a trench prior to trench formation. After formation of the gettering layer, the trench is fabricated so that the portions damaged by defect-forming ions are removed from the silicon substrate except for those portions to be left intact to constitute the gettering layer. This permits formation of the desired gettering layer with precision using a simplified manufacturing procedure.

An even further preferred method for manufacturing a semiconductor device according to the first aspect of the invention permits formation of side walls in openings of a trench-forming mask. This makes it possible to form the gettering region only near the bottom center of the trench.

A method for manufacturing a semiconductor device according to a second aspect of the invention permits formation of a gettering layer in regions where a trench is to be formed so that defective elements are captured into the gettering layer from with in the silicon substrate. During formation of the trench, the gettering layer having the defective elements captured therein is removed from the silicon substrate. This permits manufacture of a semiconductor device with stable characteristics having no defective layer close to element separation regions.

One preferred method for manufacturing a semiconductor device according to the second aspect of the invention causes defect-forming ions to be implanted into the silicon substrate using a trench-forming mask. In this case, a gettering layer is formed only in the regions where the trench is to be formed in a self-aligned manner. This allows the desired gettering layer to be formed with precision using a simplified manufacturing procedure.

Another preferred method for manufacturing a semiconductor device according to the second aspect of the invention forms a gettering layer by implanting defect-forming ions into a trench of a first depth whose side surfaces are covered laterally with side walls. This permits precise fabrication of the gettering layer in regions deeper than the first depth with no defective layer formed laterally along the trench.

A further preferred method for manufacturing a semiconductor device according to the second aspect of the invention fabricates side walls in openings of a trench-forming mask so as to form a gettering layer only near the bottom center of a trench. This ensures removal of the defective layer from the silicon substrate during formation of the trench.

According to a third aspect of the present invention, defective elements within the silicon substrate are captured into the gettering layer, and any gettering layer is prevented from appearing in regions that may be in contact with an impurity layer formed near the surface of the silicon substrate. These feature makes it possible to manufacture a semiconductor device with quite stable characteristics.

Further, the present invention is not limited to these embodiments, but variations and modifications may be made without departing from the scope of the present invention.

The entire disclosure of Japanese Patent Application No. 2000-207674 filed on Jul. 10, 2000 including specification, claims, drawings and summary are incorporated herein by reference in its entirety.

What is claimed is:

1. A method for manufacturing a semiconductor device having a trench isolation structure, said method comprising:
   forming a trench forming mask over said silicon substrate;
   etching said silicon substrate using said trench-forming mask so as to form a trench in said silicon substrate;
   forming side walls for covering laterally said trench; and
   implanting defect-forming ions into said silicon substrate using said trench-forming mask and said side walls as a mask to form a gettering layer only at a bottom of the trench in said silicon substrate.

2. A method for manufacturing a semiconductor device having a trench isolation structure, said method comprising:
   furnishing a trench-forming mask over said silicon substrate;
   implanting defect-forming ions, using said trench-forming mask as mask, to form a gettering layer deeper than regions where a trench is to be formed in said silicon substrate; and
   etching said silicon substrate by use of said trench-forming mask following implantation of said defect-forming ions, thereby forming said trench in said silicon substrate, wherein the gettering layer is formed only at a bottom of the trench formed in said silicon substrate.

3. The method for manufacturing a semiconductor device according to claim 2, further comprising the step of forming side walls for laterally covering openings in said trench-forming mask;
   wherein said defect-forming ions are implanted into said silicon substrate using said trench-forming mask and said side walls as a mask.

4. A method for manufacturing a semiconductor device having a trench isolation structure, said method comprising the steps of:
   implanting defect-forming ions into a silicon substrate so as to form a gettering layer in regions where a trench is to be formed in said silicon substrate;
   capturing defective elements into said gettering layer from within said silicon substrate; and
   removing said gettering layer having said defective elements captured therein during formation of said trench in said silicon substrate.

5. The method for manufacturing a semiconductor device according to claim 4, further comprising the step of furnishing a trench-forming mask over said silicon substrate;
   wherein said defect-forming ions are implanted, using said trench-forming mask as a mask, into the regions where said trench is to be formed in said silicon substrate.

6. The method for manufacturing a semiconductor device according to claim 5, wherein said step of forming said gettering layer further comprises the steps of:
   etching said silicon substrate using said trench-forming mask so as to form a trench having a first depth in said silicon substrate;
   forming side walls for covering laterally said trench having said first depth; and
   implanting said defect-forming ions into said silicon substrate using said trench-forming mask and said side walls as a mask so as to form a gettering layer at a bottom of said trench having said first depth; and
   wherein said step of removing said gettering layer further comprises the step of etching said trench having said first depth down to a second depth in order to remove said gettering layer having said defective elements captured therein.

7. The method for manufacturing a semiconductor device according to claim 5, further comprising the step of forming side walls for covering laterally openings of said trench-forming mask;
   wherein said defect-forming ions are implanted into said silicon substrate using said trench-forming mask and said side walls as a mask.

* * * * *